United States Patent
Matsuo

(10) Patent No.: US 9,209,814 B2
(45) Date of Patent: Dec. 8, 2015

(54) CR OSCILLATION CIRCUIT

(71) Applicant: DENSO CORPORATION, Kariya, Aichi-pref. (JP)

(72) Inventor: Kazushi Matsuo, Takahama (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/361,411

(22) PCT Filed: Dec. 11, 2012

(86) PCT No.: PCT/JP2012/007886
§ 371 (c)(1),
(2) Date: May 29, 2014

(87) PCT Pub. No.: WO2013/099121
PCT Pub. Date: Jul. 4, 2013

(65) Prior Publication Data
US 2014/0340164 A1   Nov. 20, 2014

(30) Foreign Application Priority Data

Dec. 28, 2011 (JP) ................................. 2011-287616
Jul. 2, 2012 (JP) ................................. 2012-148429

(51) Int. Cl.
*H03K 3/26* (2006.01)
*H03L 7/00* (2006.01)
*H03B 1/00* (2006.01)
*H03L 1/02* (2006.01)
*H03K 3/0231* (2006.01)

(52) U.S. Cl.
CPC .. *H03L 7/00* (2013.01); *H03B 1/00* (2013.01); *H03K 3/0231* (2013.01); *H03L 1/026* (2013.01)

(58) Field of Classification Search
CPC ......... H03K 3/0231; H03B 1/00; H03L 1/026
USPC .......................................... 331/111, 143, 176
See application file for complete search history.

(56) References Cited

U.S. PATENT DOCUMENTS 7,129,798 B2 * 10/2006 Aoyama et al. ............... 331/135
7,531,852 B2 *  5/2009 Ueda et al. ..................... 257/203
(Continued)

FOREIGN PATENT DOCUMENTS

| JP | S62-18997 A | 1/1987 |
| JP | S62-299109 A | 12/1987 |
| JP | H9-113310 A | 5/1997 |
| JP | H10-281912 A | 10/1998 |
| JP | 2005-333298 A | 12/2005 |
| JP | 2008-164380 A | 7/2008 |

OTHER PUBLICATIONS

International Search Report of the International Searching Authority mailed Jan. 15, 2013 for the corresponding international application No. PCT/JP2012/007886.

(Continued)

*Primary Examiner* — Arnold Kinkead
(74) *Attorney, Agent, or Firm* — Posz Law Group, PLC

(57) ABSTRACT

In a CR oscillation circuit, resistance elements forming a series circuit include a first resistance element having a large temperature coefficient of resistance and a second resistance element having a smaller temperature coefficient of resistance than the first resistance element. At least one of a capacitor and an oscillation resistance element is trimmable. A first switching circuit connected between the series circuit and a non-inverting input terminal of a comparator is turned on when an output signal of the comparator is at a high level, and a second switching circuit is turned on when the output signal is at a low level.

8 Claims, 8 Drawing Sheets

(56) References Cited

U.S. PATENT DOCUMENTS

| | | | |
|---|---|---|---|
| 8,212,624 B2 * | 7/2012 | Tokunaga et al. | 331/111 |
| 2004/0075507 A1 | 4/2004 | Aoyama et al. | |
| 2005/0219034 A1 | 10/2005 | Yoshikawa | |
| 2005/0274982 A1 | 12/2005 | Ueda et al. | |
| 2006/0109060 A1 | 5/2006 | Nishi et al. | |
| 2006/0195711 A1 | 8/2006 | Matsuoka et al. | |

OTHER PUBLICATIONS

Written Opinion of the International Searching Authority mailed Jan. 15, 2013 for the corresponding international application No. PCT/JP2012/007886.

Office Action mailed by the Japan Patent Office on Oct. 1, 2013 in corresponding Japanese application No. 2012-148429.

* cited by examiner

TEMPERATURE HIGH ⇒ DELAY AMOUNT LARGE ⇒ OSCILLATION FREQUENCY LOW

CR OSCILLATION CIRCUIT

CROSS REFERENCE TO RELATED APPLICATION

This application is a U.S. national stage application of International Patent Application No. PCT/JP2012/007886 filed on Dec. 11, 2012, and is based on Japanese Patent Application No. 2011-287616 filed on Dec. 28, 2011 and Japanese Patent Application No. 2012-148429 filed on Jul. 2, 2012, the disclosures of which are incorporated herein by reference.

TECHNICAL FIELD

The present disclosure relates to a CR oscillation circuit.

BACKGROUND ART

An oscillation frequency of a CR oscillation circuit changes with temperature. Thus, various techniques for performing a correction to maintain a constant oscillation frequency have been suggested. For example, in the patent document 1, an oscillation frequency of a CR oscillation circuit itself is not corrected, and in a communication circuit for determining a communication rate based on an oscillation clock signal, a correction value for maintaining a constant communication rate is set.

PRIOR ART DOCUMENTS

Patent Document

[Patent Document 1] JP-A-2006-270917 (corresponding to US 2006/0195711 A1)

SUMMARY OF INVENTION

Technical Problem

However, in the configuration of the patent document 1, a circuit detecting a temperature, a memory storing the correction value, a digital PLL circuit multiplying the oscillation clock signal of the CR oscillation circuit based on the correction value, and the like are necessary. Thus, there are problems that a dimension of the circuit increases and a process of setting the correction value becomes complicated.

In view of the foregoing problems, it is an object of the present invention to provide a CR oscillation circuit that can adjust a temperature property with a simple configuration.

Solution to Problem

A CR oscillation circuit according to a first aspect of the present disclosure includes a capacitor, an oscillation resistance element, a comparator, a series circuit, a first switching circuit, and a second switching circuit. The comparator has an inverting input terminal connected to a ground via the capacitor and connected to an output terminal via the oscillation resistance element. The series circuit includes at least three resistance elements connected in series between a power source and the ground. The first switching circuit has one end connected to a low potential side terminal of the resistance element that is in the series circuit and is connected to the power source, and has another end connected to a non-inverting input terminal of the comparator. The second switching circuit has one end connected to a high potential side terminal of the resistance element that is in the series circuit and is connected to the ground, and has another end connected to the non-inverting input terminal. The first switching circuit is turned on when an output signal of the comparator is at a high level, and the second switching circuit is turned on when the output signal is at a low level. The resistance elements forming the series circuit include a first resistance element having a large temperature coefficient of resistance and a second resistance element having a smaller temperature coefficient of resistance than the first resistance element. At least one of the capacitor and the oscillation resistance element is configured to be trimmable.

The CR oscillation circuit according to the first aspect can adjust a temperature property with a simple configuration.

A CR oscillation circuit according to a second aspect of the present disclosure includes a capacitor, an oscillation resistance element, a comparator, a series circuit, a first switching circuit, and a second switching circuit. The comparator has an inverting input terminal connected to a ground via the capacitor and connected to an output terminal via the oscillation resistance element. The series circuit includes at least three resistance elements connected in series between a power source and the ground. The first switching circuit has one end connected to a low potential side terminal of the resistance element that is in the series circuit and is connected to the power source, and has another end connected to a non-inverting input terminal of the comparator. The second switching circuit has one end connected to a high potential side terminal of the resistance element that is in the series circuit and is connected to the ground, and has another end connected to the non-inverting input terminal. The first switching circuit is turned on when an output signal of the comparator is at a high level, and the second switching circuit is turned on when the output signal is at a low level. The oscillation resistance element is formed of a series circuit of a first resistance element having a smaller temperature coefficient of resistance than the resistance elements forming the series circuit and a second resistance element configured to be trimmable.

The CR oscillation circuit according to the second aspect can also adjust a temperature property with a simple configuration.

A CR oscillation circuit according to a third aspect of the present disclosure includes a capacitor, an oscillation resistance element, a comparator, a series circuit, a first switching circuit, and a second switching circuit. The comparator has an inverting input terminal connected to a ground via the capacitor and connected to an output terminal via the oscillation resistance element. The series circuit includes at least three resistance elements connected in series between a power source and the ground. The first switching circuit has one end connected to a low potential side terminal of the resistance element that is in the series circuit and is connected to the power source, and has another end connected to a non-inverting input terminal of the comparator. The second switching circuit has one end connected to a high potential side terminal of the resistance element that in the series circuit and is connected to the ground, and has another end connected to the non-inverting input terminal. The first switching circuit is turned on when an output signal of the comparator is at a high level, and the second switching circuit is turned on when the output signal is at a low level. The oscillation resistance element has a smaller temperature coefficient of resistance than the resistance elements forming the series circuit, and the capacitor is configured to be trimmable.

The CR oscillation circuit according to the third aspect can also adjust a temperature property with a simple configuration.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

First Embodiment

Figure 1:
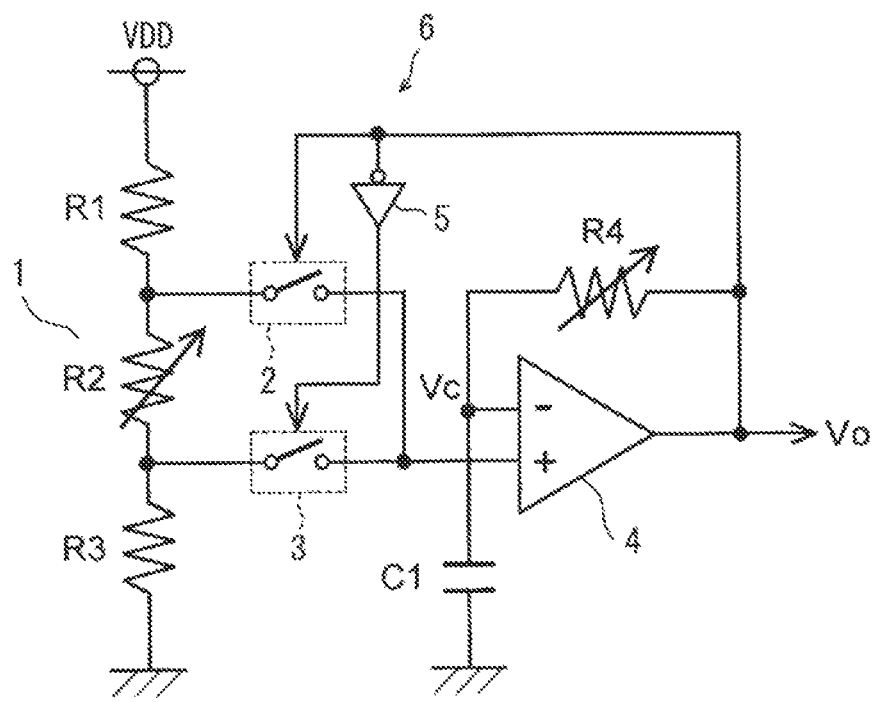
FIG. 1 is a diagram illustrating a CR oscillation circuit according to a first embodiment of the present disclosure.

A CR oscillation circuit 6 according to a first embodiment of the present disclosure will be described with reference to FIG. 1 to FIG. 5. As illustrated in FIG. 1, resistance elements R1-R3 are connected in series between a power source VDD and a ground and form a series circuit 1. The resistance elements R1, R3 (first resistance elements) have positive temperature properties. The resistance element R2 is selected to have a smaller temperature coefficient of resistance than the resistance elements R1, R3 and is formed of a trimmable element. Any trimming method may be applied. For example, a variable resistance element may be used, or a laser trimming may be performed.

When the CR oscillation circuit 6 is formed, for example, as an integrated circuit, P-well resistors having temperature coefficients of resistance about 9000 ppm/° C. may be used as the resistance elements R1, R3. As the resistance element R2, an element having a smaller temperature coefficient of resistance than the resistance elements R1, R3, such as, a CrSi resistor (whose temperature coefficient of resistance is about ± several 10 ppm/° C.) may be used.

A common connection point of the resistance elements R1, R2 (a low potential side terminal of the resistance element R1) is connected to a non-inverting input terminal of a comparator 4 via a first switching circuit 2. A common connection point of the resistance elements R2, R3 (a high potential side terminal of the resistance element) is connected to the non-inverting input terminal via a second switching circuit 3. An inverting input terminal of the comparator 4 is connected to the ground via a capacitor C1 and is connected to an output terminal of the comparator 4 via a resistance element R4 (an oscillation resistance element).

An output signal Vo of the comparator 4 is applied as control signals of switching the first switching circuit 2 and the second switching circuit 3. The second switching circuit 3 receives a signal inverted via a NOT gate 5. The switching circuits 2 and 3 are turned on when the control signal is at a high level. When the output signal Vo is at a high level, only the first switching circuit 2 is turned on. When the output signal Vo is at a low level, only the second switching circuit 3 is turned on. The switching circuits 2, 3 may be formed of transistors, analog switches, or the like. The above components form the CR oscillation circuit 6.

Figure 2:
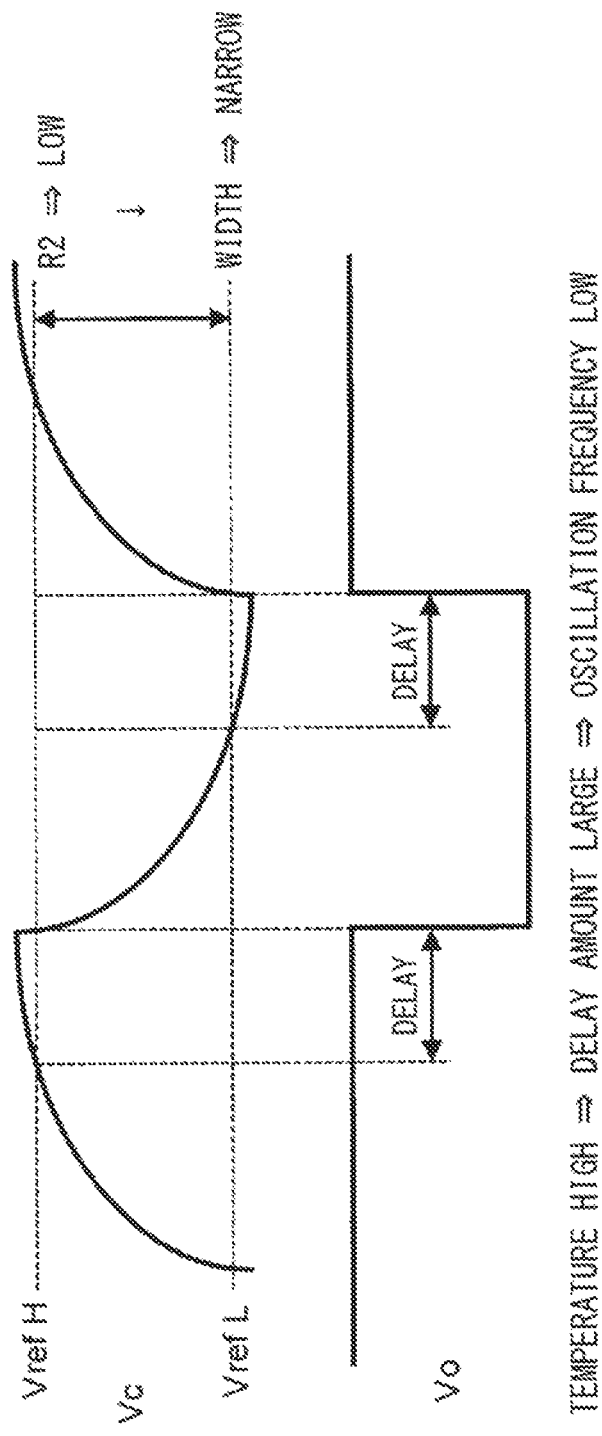
FIG. 2 is a diagram illustrating waveforms of a terminal voltage Vc of a capacitor and an output signal Vo of a comparator.

Next, an operation of the present embodiment will be described with reference to FIG. 2 to FIG. 5. FIG. 2 is a diagram illustrating waveforms of a terminal voltage (a potential of the inverting input terminal) Vc of the capacitor C1 and the output signal Vo of the comparator. During a period in which the output signal Vo is at the high level, the capacitor C1 is charged and the terminal voltage Vc increases. During a period in which the output signal Vo is at the low level, the capacitor C1 is discharged and the terminal voltage Vc decreases.

In FIG. 2, two threshold voltages VrefH, VrefL applied to the inverting input terminal of the comparator 4 are illustrated by dashed lines. During the period in which the output signal Vo is at the high level, because the first switching circuit 2 is turned on, a threshold voltage becomes VrefH that is higher level. During the period in which the output signal Vo is at the low level, because the second switching circuit 3 is turned on, the threshold voltage becomes VrefL that is lower level. "DELAY" illustrated in FIG. 2 is caused by a temperature property of the comparator 4 and indicates that a time at which the output signal Vo changes delays from a time point at which the terminal voltage Vc intersects the threshold voltages VrefH, VrefL due to increase in the temperature.

Figure 3A:
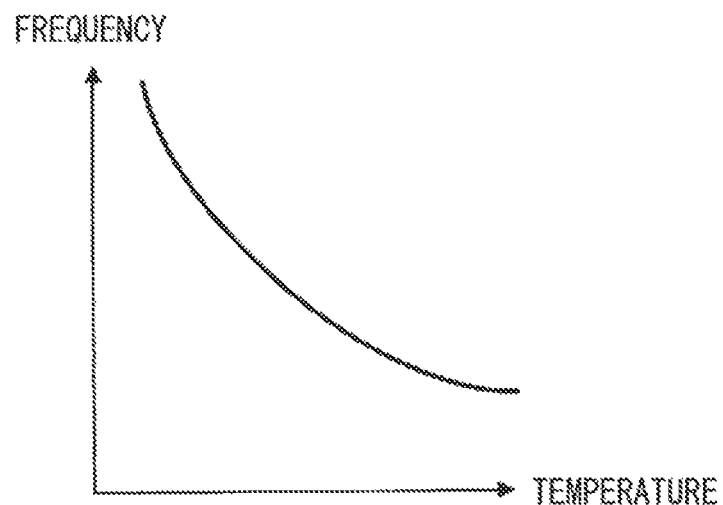
FIG. 3A is a diagram illustrating a relationship between a temperature and an oscillation frequency.
Figure 3B:
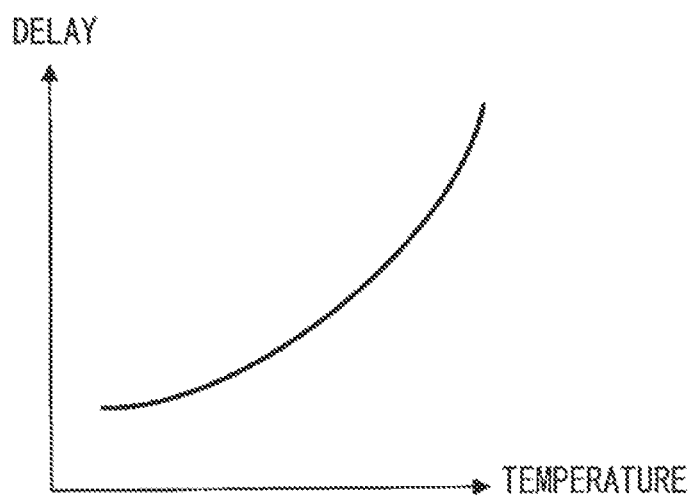
FIG. 3B is a diagram illustrating a relationship between a temperature and an output response delay time of a comparator.

FIG. 3A is a diagram illustrating a relationship between the temperature and the oscillation frequency of the CR oscillation circuit to which an adjustment is not performed. In other words, FIG. 3A illustrates a change of the oscillation frequency due to increase in an output response delay time of the comparator 4. FIG. 3B illustrates a relationship between the temperature and the output response delay time of the comparator 4. The oscillation frequency of the CR oscillation circuit decreases with increase in the temperature. On the other hand, because the resistance elements R1, R3 have positive temperature properties, the resistance values of the resistance elements R1, R3 increase with increase in the temperature, and a potential difference of the threshold voltages VrefH, VrefL illustrated in FIG. 2 decreases (the delay time decreases). In addition, if the resistance element R2 is trimmed to decrease the resistance value, the potential difference of the threshold voltages VrefH, VrefL decreases. Thus, if the resistance value of the resistance element R2 is changed, a contraction degree of the potential difference of the threshold values VrefH, VrefL changes with increase in the temperature, and the temperature property of the comparator 4 can be adjusted.

Figure 4:
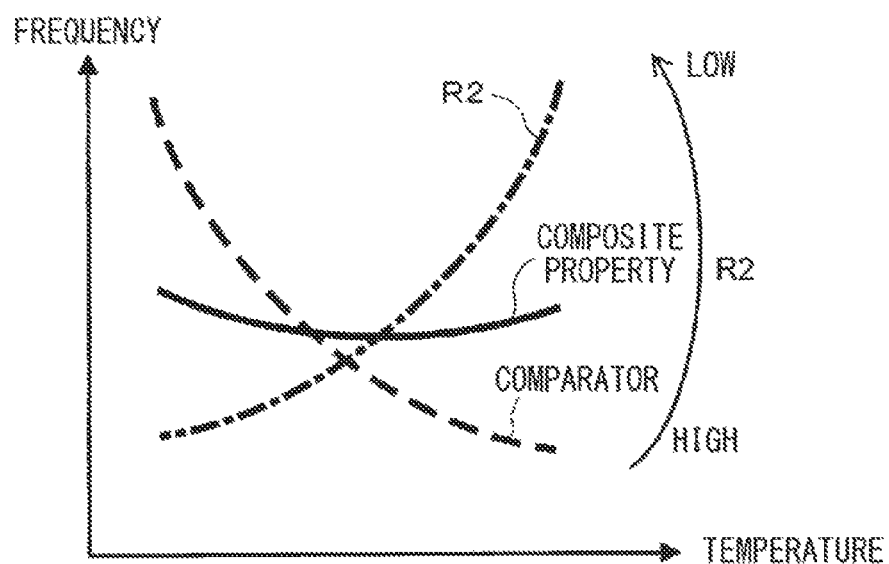
FIG. 4 is a diagram explaining a method of adjusting a temperature property of the CR oscillation circuit.

FIG. 4 is a diagram explaining a method of adjusting the temperature property of the CR oscillation circuit 6 by trimming of the resistance value of the resistance element R2. An oscillation frequency property based on the temperature property of the comparator 4 illustrated by a dashed line decreases to a right lower side with increase in the temperature in a manner similar to FIG. 3A. In addition, an oscillation frequency property based on the temperature property of the threshold voltage of the comparator 4, which is illustrated by a dashed-dotted line in the diagram, changes continuously from a property of decreasing to the right lower side to a property of increasing to a right upper side due to a combination of the temperature properties of the resistance elements R1, R3 and a result of increasing or decreasing the resistance value of the resistance element R2. Then, the temperature property as the CR oscillation circuit 6 becomes a composition of the both properties.

Figure 5:
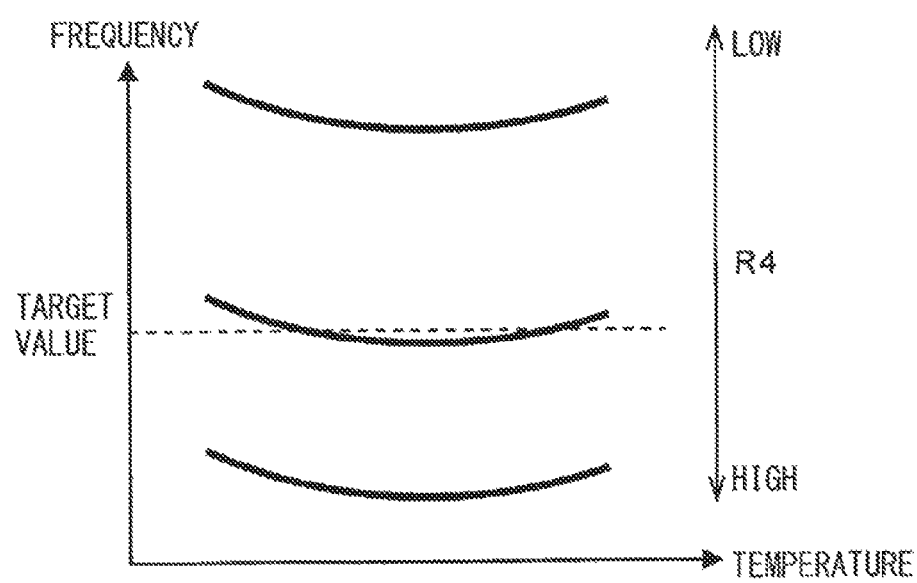
FIG. 5 is a diagram explaining a state in which an oscillation frequency of the CR oscillation circuit is finally adjusted.

Thus, an operator monitors the frequency of the output signal Vo while changing an operating environment temperature of the CR oscillation circuit 6 and trims the resistance value of the resistance element R2. As a result, as illustrated by a solid line in FIG. 4, the oscillation frequency is adjusted to be almost constant in an expected operating temperature range. FIG. 5 is a diagram explaining a state in which the oscillation frequency of the CR oscillation circuit 6 is finally adjusted. After the temperature property is adjusted to be almost flat by the adjustment illustrated in FIG. 4, the resistance value of the resistance element R4 is trimmed so that the oscillation frequency approaches a target value.

A capacitance of the capacitor C1 may also be trimmed or both may also be trimmed in parallel. In short, it is necessary only to adjust a CR time constant of the CR oscillation circuit 6. In a case where the capacitance is trimmed, for example, a plurality of capacitors may be prepared, and the number of parallel connection may be changed.

As described above, in the present embodiment, the series circuit 1 including three resistance elements R1-R3 is disposed between the power source VDD and the ground, the resistance elements R1, R3 are selected to have the positive temperature properties and the resistance element R2 is selected to have the smaller temperature coefficient of resistance than the resistance elements R1, R3. In addition, at least one of the capacitor C1 and the resistance element R4 is selected to be trimmable. The first switching circuit 2 connected between the series circuit 1 and the non-inverting input terminal of the comparator 4 is turned on when the output signal Vo of the comparator 4 is at the high level. The second switching circuit 3 is turned on when the output signal Vo is at the low level. Thus, when the resistance value of the resistance element R2 is trimmed, the potential difference between the threshold voltages VrefH, VrefL can be changed by combination with the changes of the resistance values of the resistance elements R1, R3 having the positive temperature properties, and the temperature property of the comparator 4 can be adjusted so that the frequency of the output signal Vo is almost constant even when the temperature changes.

Second Embodiment

Figure 6:
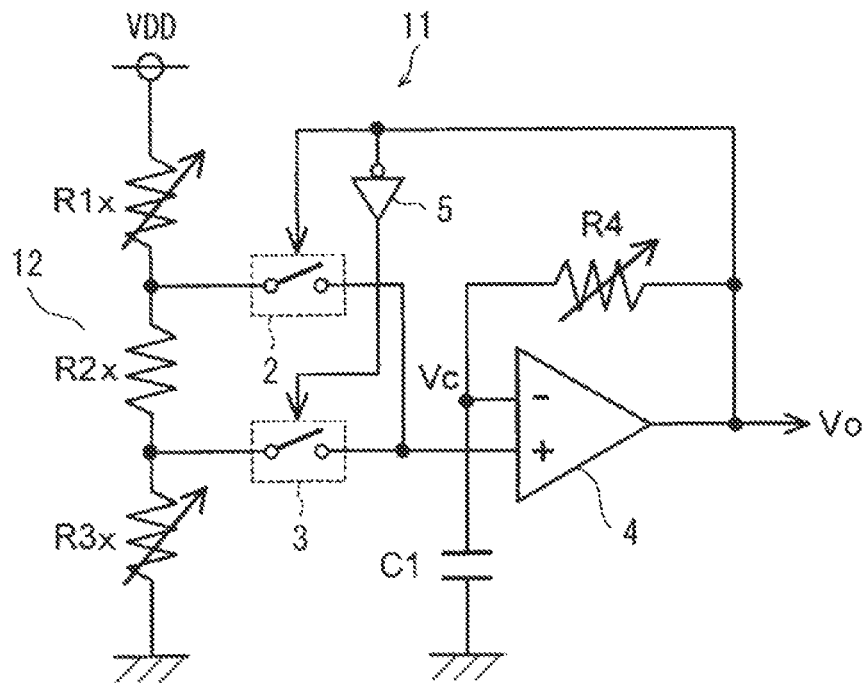
FIG. 6 is a diagram illustrating a CR oscillation circuit according to a second embodiment of the present disclosure.
Figure 7:
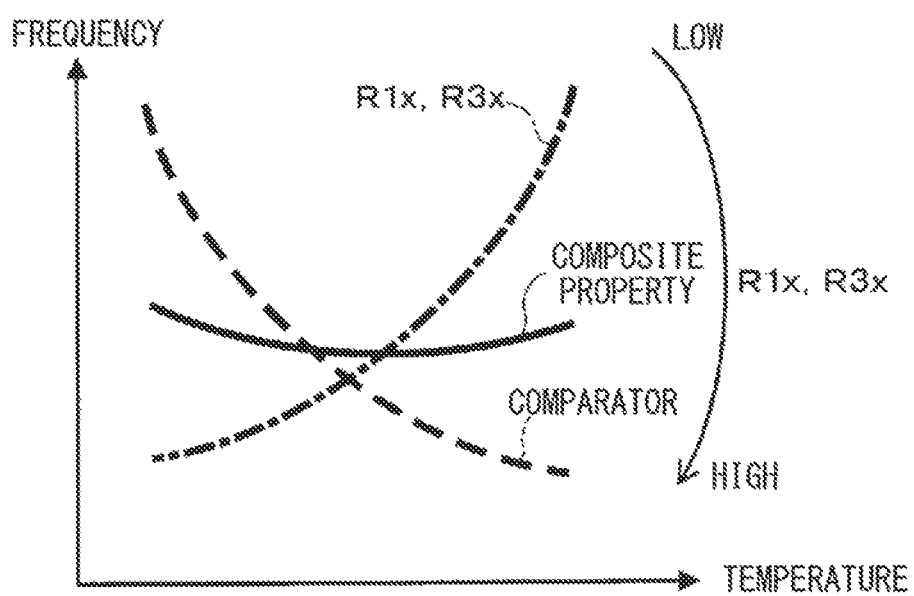
FIG. 7 is a diagram explaining a method of adjusting a temperature property of the CR oscillation circuit according to the second embodiment.

A CR oscillation circuit 11 according to a second embodiment of the present disclosure will be described with reference to FIG. 6 and FIG. 7. The same portions as the first embodiment are denoted by the same reference numerals and description about the portions will be omitted. Portions different from the first embodiment will be described below. The CR oscillation circuit 11 is different from the CR oscillation circuit 6 in that the series circuit 1 is replaced by the series circuit 12. The series circuit 12 includes resistance elements R1x-R3x connected in series. In this case, the resistance element R2x is an element (a first resistance element) having a negative temperature property. The resistance elements R1x, R3x are elements (second resistance elements) having smaller temperature coefficients of resistance than the resistance element R2x and being trimmable.

Next, an operation of the CR oscillation circuit 11 will be described with reference to FIG. 7. In the CR oscillation circuit 11, a combination of the temperature properties of the resistance elements R1x-R3x forming the series circuit 12 and the trimmable elements is opposite from the first embodiment. Because the resistance element R2x has the negative temperature property, the resistance value of the resistance element R2x decreases with increase in the temperature, and the potential difference of the threshold voltages VrefH, VrefL decreases. In addition, the potential difference decreases when the resistance values of the resistance elements R1x, R3x are increased by trimming, and the potential difference increases when the resistance values are decreased. Thus, by the combination of the above properties, the frequency of the output signal Vo can be adjusted as illustrated in FIG. 7 in a manner similar to the first embodiment. In this case, it is preferable that the resistance elements R1x, R3x are trimmed so that increase/decrease values of the R1x, R3x are equal to each other.

As described above, according to the present embodiment, in the series circuit 12, the resistance element R1x whose one end is connected to the power source and the resistance element R3x whose one end is connected to the ground are trimmable, and the resistance element R2x connected between the two resistance elements has the negative property. Thus, the delay of the output response of the comparator 4 can be adjusted by the combinations, and effects similar to the first embodiment can be obtained.

Third Embodiment

Figure 8:
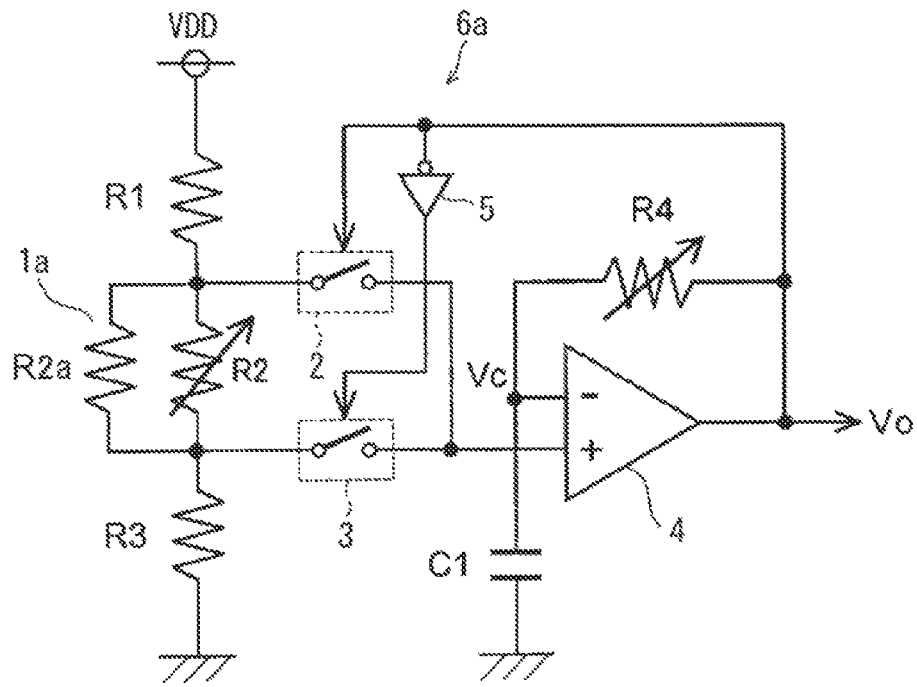
FIG. 8 is a diagram illustrating a CR oscillation circuit according to a third embodiment of the present disclosure.
Figure 9:
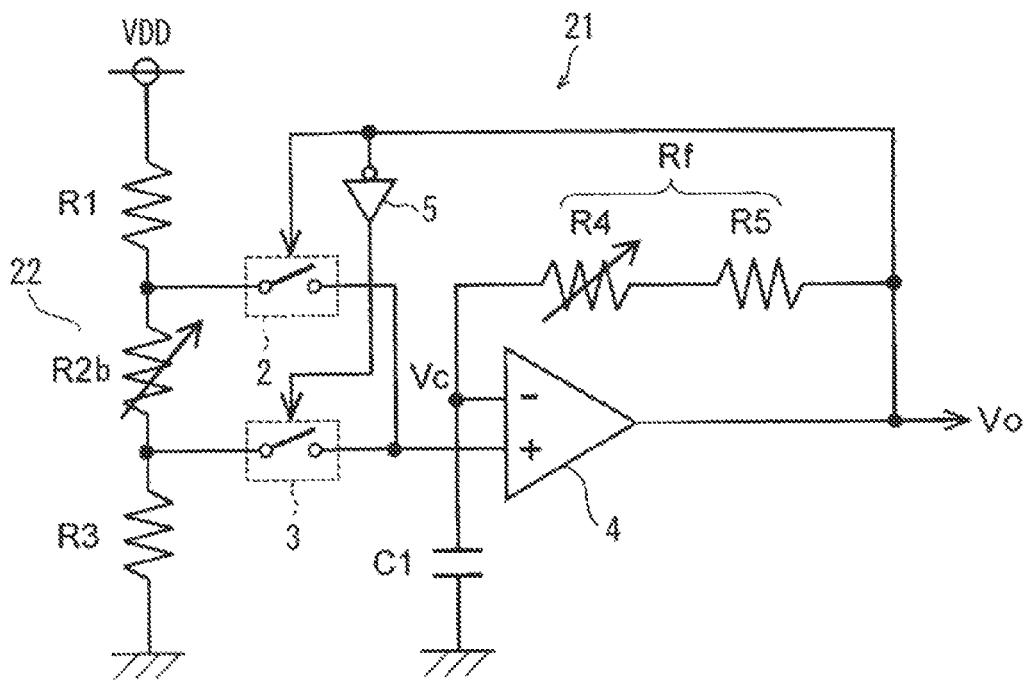
FIG. 9 is a diagram illustrating a CR oscillation circuit according to a fourth embodiment of the present disclosure.

A CR oscillation circuit 6a according to a third embodiment of the present disclosure will be described with reference to FIG. 8. In the present embodiment, a resistance element R2a as a second resistance element is connected in parallel with the resistance element R2. A trimming may be performed to the resistance element R2 in a manner similar to the first embodiment. Otherwise, the resistance element R2a may be connected in series with the resistance element R2, or other resistance elements (whose temperature properties are equal to the temperature properties of the resistance elements R1, R3) may be connected in series or parallel with the resistance elements R1, R3 as first resistance elements. In other words, each of the first to third resistance elements may be formed of more than one element.

Fourth Embodiment

A CR oscillation circuit 21 according to a fourth embodiment of the present disclosure will be described with reference to FIG. 9 to FIG. 12. In the CR oscillation circuit 21 according to the present embodiment, the resistance element R2 forming the series circuit 1 of the first embodiment is replaced by the resistance element R2b to form a series circuit 22. The resistance element R2b has the same temperature coefficient of resistance (the same material) as the resistance elements R1, R3 and is configured to be trimmable in a manner similar to the resistance element R2. In addition, between the output terminal of the comparator 4 and the resistance element R4 (corresponding to a second resistance element), a resistance element R5 (corresponding to a first resistance element) is inserted.

The resistance element R5 has a smaller temperature coefficient of resistance than the resistance element R4. For example, a CrSi resistor may be used as the resistance element R5 in a manner similar to the resistance element R2 according to the first embodiment, or the resistance element R5 may be made of material having a negative temperature property in a manner similar to the resistance element R2x of the second embodiment. A series composite resistor of the resistance elements R4, R5 is referred to as Rf (an oscillation resistance element).

Figure 11:
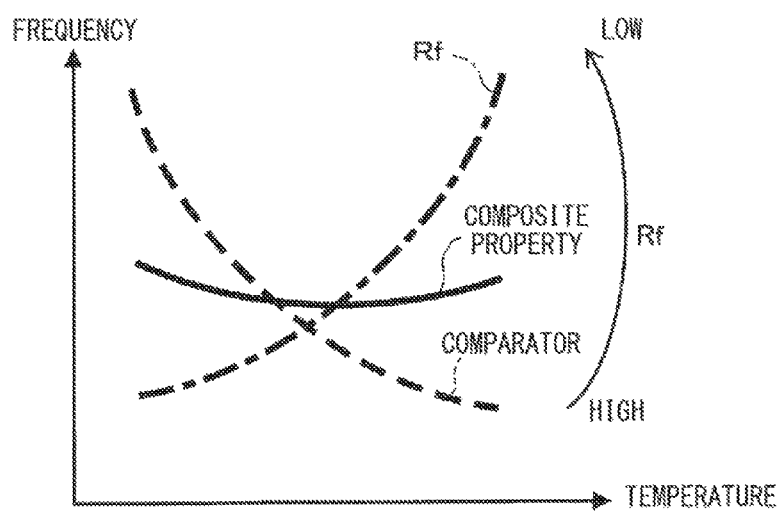
FIG. 11 is a diagram explaining a method of adjusting a temperature property of the CR oscillation circuit according to the fourth embodiment.
Figure 12:
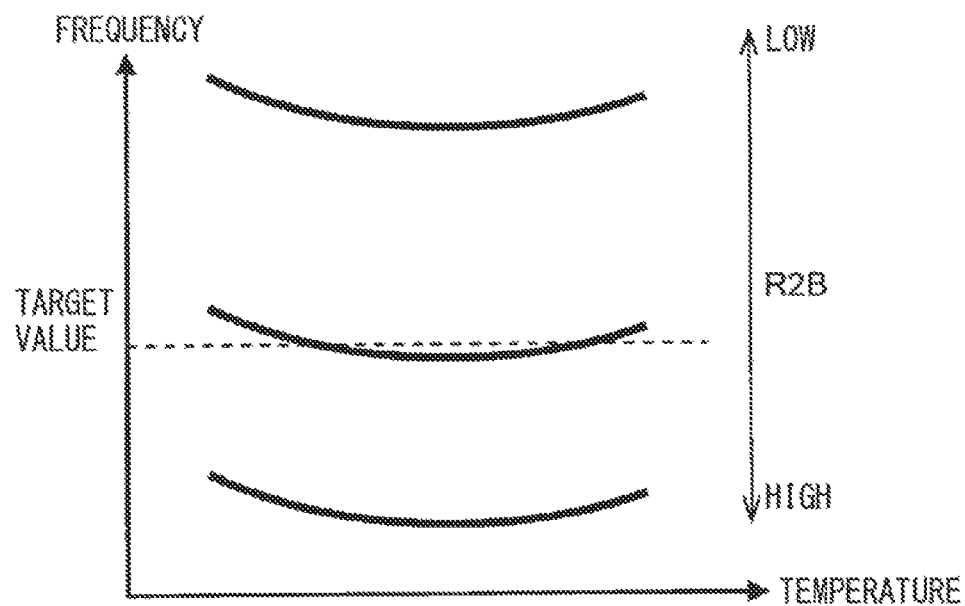
FIG. 12 is a diagram explaining a state in which an oscillation frequency of the CR oscillation circuit according to the fourth embodiment is finally adjusted.

Next, an operation of the fourth embodiment will be described with reference to FIG. 10 to FIG. 12. As described above, the oscillation frequency property based on the temperature property of the comparator 4 decreases with increase in the temperature. In the present embodiment, the resistance element R5 has the smaller temperature coefficient of resistance than the resistance element R4 or has the negative temperature property, there is a relationship of adjusting the temperature property of the comparator 4. When the resistance value of the resistance element R4 is trimmed, the resistance value of the composite resistor Rf changes, and a weight of the temperature property of the resistance element R5 contributing the oscillation frequency also changes.

Figure 10:
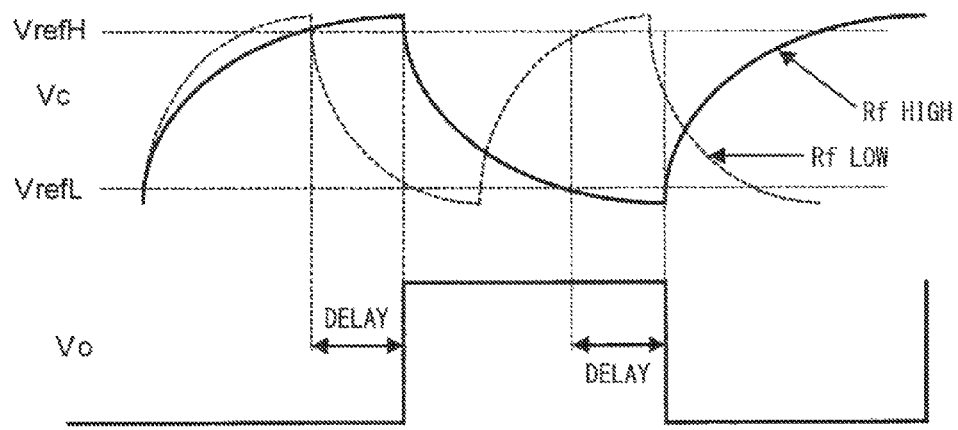
FIG. 10 is a diagram illustrating waveforms of a terminal voltage Vc of a capacitor and an output signal Vo of a comparator.

As illustrated in FIG. 10, when the resistance value of the composite resistor Rf decreases, a charging and discharging speed of the capacitor C1 increases and the oscillation frequency increases. When the resistance value of the composite resistor Rf increases, the charging and discharging speed decreases, and the oscillation frequency decreases. In FIG. 11 corresponding to FIG. 4, the oscillation frequency property based on the temperature property of the comparator 4, which is illustrated by a dashed-dotted line, basically has a property of decreasing to a right lower side. The oscillation frequency property based on the temperature property of the composite resistor Rf basically has a property of increasing to a right upper side. Because the composition of both is the oscillation frequency property as the CR oscillation circuit 21, the above-described property can be adjusted when the resistance value of the composite resistor Rf is changed by trimming of the resistance element R4.

Thus, an operator monitors the frequency of the output signal Vo while changing an operating environment temperature of the CR oscillation circuit 21 and trims the resistance value of the resistance element R4. As a result, as illustrated by a solid line in FIG. 11, the oscillation frequency is adjusted to be almost constant in an expected operating temperature range. Then, as illustrated in FIG. 12, after the temperature property is adjusted to be almost flat, the resistance value of the resistance element R2b in the series circuit 22 is trimmed (here, the threshold value of the comparator 4 is changed) so that the oscillation frequency of the CR oscillation circuit 21 finally approaches a target value.

As described above, in the present embodiment, the resistance elements R1, R2b, R3 forming the series circuit 22 are made of material having the same temperature coefficient of resistance, and the oscillation resistance element Rf is formed of the series circuit of the resistance element R4 configured to be trimmable and the resistance element R5 having the smaller temperature property than the resistance element R4 or having the negative temperature property.

Thus, decrease in the oscillation frequency with respect to increase in the temperature can be restricted by using the resistance element R5. When the resistance value of the resistance element R4 is trimmed, the weight of the resistance element R5 in the oscillation resistance element Rf changes, the charging and discharging speed of the capacitor C1 changes, and the oscillation frequency can be adjusted.

Accordingly, the delay of the output response of the comparator 4 is adjusted and the temperature property of the oscillation frequency can be adjusted. Because the resistance element R2b forming the series circuit 22 is configured to be trimmable, even when the resistance values of the resistance elements forming the series circuit 22 vary, the resistance values can be adjusted afterward by trimming, and the temperature property can be adjusted with a higher accuracy.

Fifth Embodiment

Figure 13:
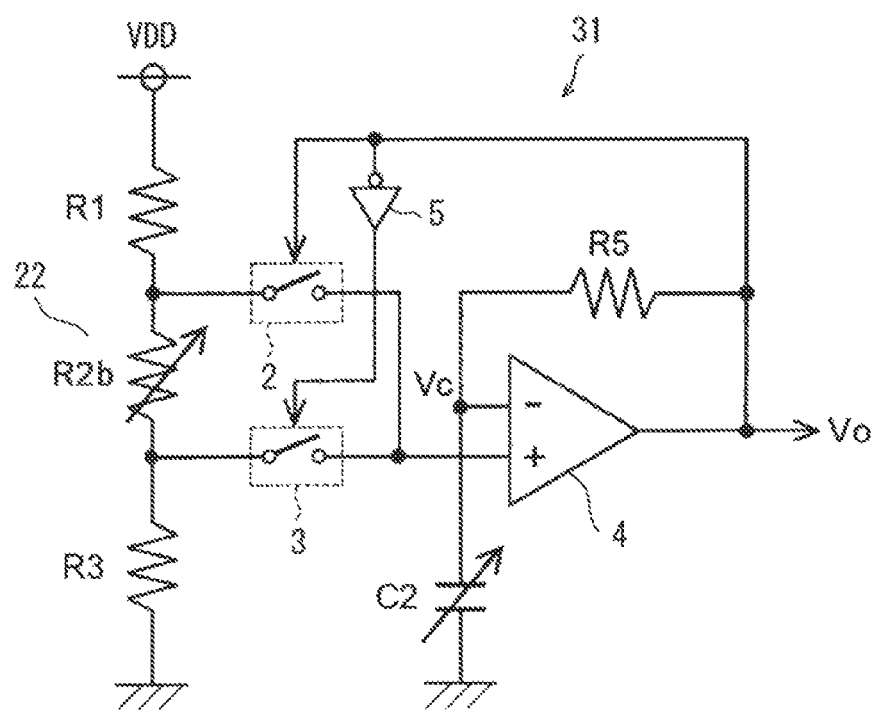
FIG. 13 is a diagram illustrating a CR oscillation circuit according to a fifth embodiment of the present disclosure.

A CR oscillation circuit 31 according to a fifth embodiment of the present disclosure will be described with reference to FIG. 13. The CR oscillation circuit 31 according to the present embodiment is different from the CR oscillation circuit 21 according to the fourth embodiment in that the resistance element R2 is omitted, and the capacitor C1 is replaced by a capacitor C2 that is trimmable. Also in this configuration, because the charging and discharging speed can be adjusted by changing a capacitance of the capacitor C2, effects similar to the fourth embodiment can be obtained.

The present disclosure is not limited only to the embodiments described above or described in the drawings, and the following modification or expansion is possible.

In the first to third embodiments, the second resistance element is the trimmable element. However, it is not always necessary that the second resistance element is trimmable. If the temperature property of the CR oscillation circuit and the temperature property of the first resistance element can be grasped in advance, the resistance value of the second resistance element can be selected considering the temperature properties.

As the first resistance element in the first embodiment, for example, a metal film resistor may also be used. As the first resistance element in the second embodiment, for example, a carbon film resistor may also be used. As the second resistance element, for example, a metal thin film resistor other than the CrSi resistor may also be used. Also in the fourth and fifth embodiments, the resistance element R2b may be configured to be trimmable as necessary.

The invention claimed is:
1. A CR oscillation circuit comprising:
a capacitor;
an oscillation resistance element;
a comparator having an inverting input terminal connected to a ground via the capacitor and connected to an output terminal via the oscillation resistance element;
a series circuit including at least three resistance elements connected in series between a power source and the ground;
a first switching circuit having one end connected to a low potential side terminal of a power resistance element that is in the series circuit and is connected to the power source, and having another end connected to a non-inverting input terminal of the comparator; and
a second switching circuit having one end connected to a high potential side terminal of a ground resistance element that is in the series circuit and is connected to the ground, and having another end connected to the non-inverting input terminal, wherein
the first switching circuit is turned on when an output signal of the comparator is at a high level, and the second switching circuit is turned on when the output signal is at a low level,
the resistance elements forming the series circuit include a first resistance element having a large temperature coefficient of resistance and a second resistance element having a smaller temperature coefficient of resistance than the first resistance element, a resistance value of the second resistance element is trimmed so that a temperature property of an oscillation frequency becomes constant, and after the resistance value of the second resistance element is trimmed, at least one of the capacitor and the oscillation resistance element is trimmed so that the oscillation frequency approaches a target value.

2. The CR oscillation circuit according to claim 1, wherein
The CR oscillation circuit according to claim 1, wherein the first resistance element has positive temperature properties and includes the power resistance element whose one end is connected to the power source and the ground resistance element whose one end is connected to the ground in the series circuit, and
the second resistance element is connected between the power and ground resistance elements.

3. The CR oscillation circuit according to claim 1, wherein the second resistance element incudes the power resistance element whose one end is connected to the power source and the ground resistance element whose one end connected to the ground in the series circuit, and
the first resistance element is connected between the power and ground resistance elements and has a negative temperature property.

4. A CR oscillation circuit comprising:
a capacitor;
an oscillation resistance element;
a comparator having an inverting input terminal connected to a ground via the capacitor and connected to an output terminal via the oscillation resistance element;
a series circuit including at least three resistance elements connected in series between a power source and the ground;
a first switching circuit having one end connected to a low potential side terminal of the resistance element that is in the series circuit and is connected to the power source, and having another end connected to a non-inverting input terminal of the comparator; and a second switching circuit having one end connected to a high potential side terminal of the resistance element that is in the series circuit and is connected to the ground, and having another end connected to the non-inverting input terminal, wherein the first switching circuit is turned on when an output signal of the comparator is at a high level, and the second switching circuit is turned on when the output signal is at a low level, the oscillation resistance element is formed of a series circuit of a first resistance element having a smaller temperature coefficient of resistance than the resistance elements forming the series circuit and a second resistance element configured to be trimmable, a resistance value of the second resistance element is trimmed so that a temperature property of an oscillation frequency becomes constant, and after the resistance value of the second resistance element is trimmed, at least one of the capacitor and the oscillation resistance element is trimmed so that the oscillation frequency approaches a target value.

5. The CR oscillation circuit according to claim 1, wherein the second resistance element is configured such that it can be trimmed after the manufacture of the CR oscillation circuit.

6. The CR oscillation circuit according to claim 1, wherein the second resistance element is a variable resistance element.

7. The CR oscillation circuit according to claim 4, wherein the second resistance element is configured such that it can be trimmed after the manufacture of the CR oscillation circuit.

8. The CR oscillation circuit according to claim 4, wherein the second resistance element is a variable resistance element.

* * * * *